(12) United States Patent
Pierce

(10) Patent No.: US 6,440,771 B1
(45) Date of Patent: Aug. 27, 2002

(54) METHOD FOR CONSTRUCTING A WAFER INTERPOSER BY USING CONDUCTIVE COLUMNS

(75) Inventor: John L. Pierce, Dallas, TX (US)

(73) Assignee: Eaglestone Partners I, LLC, Long Beach, CA (US)

( * ) Notice: Subject to any disclaimer, the term of this patent is extended or adjusted under 35 U.S.C. 154(b) by 0 days.

(21) Appl. No.: 09/816,516

(22) Filed: Mar. 23, 2001

(51) Int. Cl.7 .............................................. H01L 21/50
(52) U.S. Cl. ..................... 438/106; 438/118; 438/612
(58) Field of Search ................................ 438/108, 125, 438/455, 460, 464, 612, 616, 106, 15, 118, 107

(56) References Cited

U.S. PATENT DOCUMENTS 6,133,070 A * 10/2000 Yagi et al. .................. 438/108

6,319,829 B1 * 11/2001 Pasco et al. ................. 257/700

\* cited by examiner

*Primary Examiner*—Tuan H. Nguyen
(74) *Attorney, Agent, or Firm*—Lawrence R. Youst; Danamraj & Youst, P.C.

(57) ABSTRACT

The present invention provides a method and apparatus for testing wafers that is simple and allows testing prior to dicing so that the need to temporarily package individual dies for testing is eliminated. As a result, the number of manufacturing steps is reduced, thus increasing first pass yields. In addition, manufacturing time is decreased, thereby improving cycle times and avoiding additional costs. The invention also provides for packaging of the die at the completion of testing. One form of the present invention provides an interposer substrate connected to a wafer through conductive columns.

24 Claims, 2 Drawing Sheets

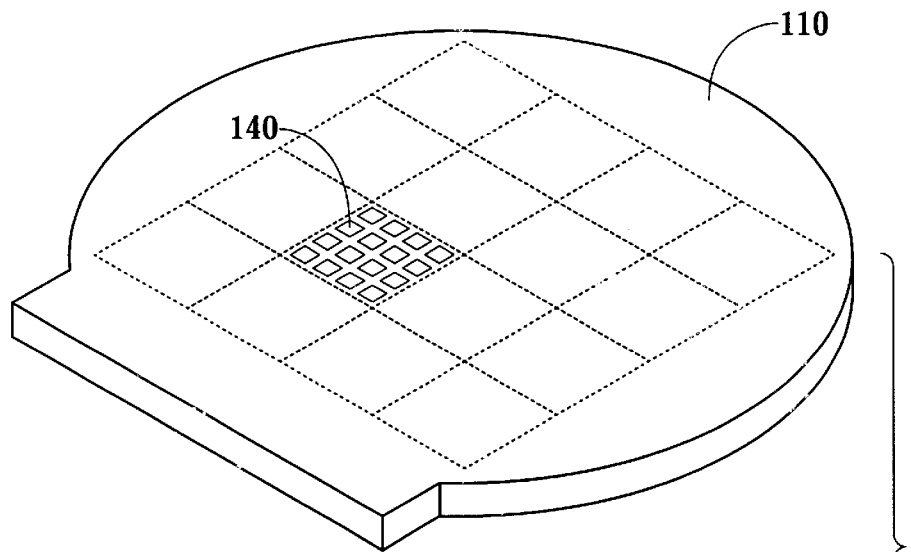
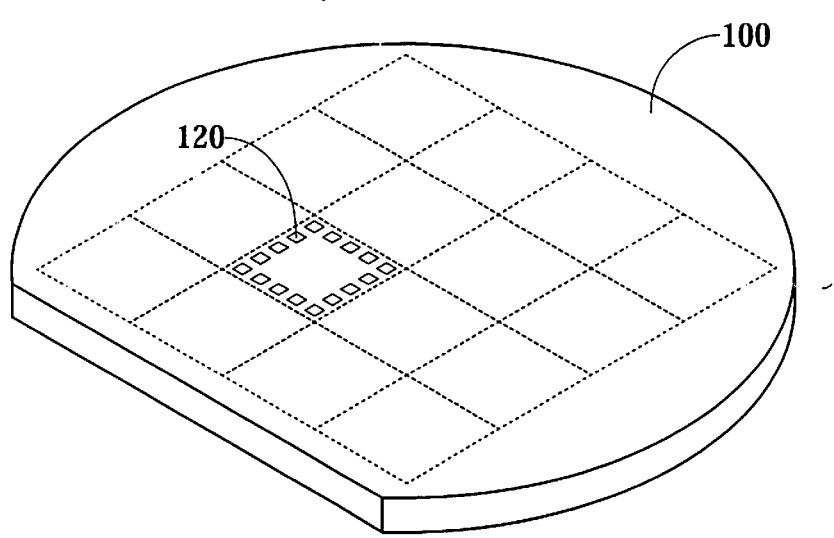
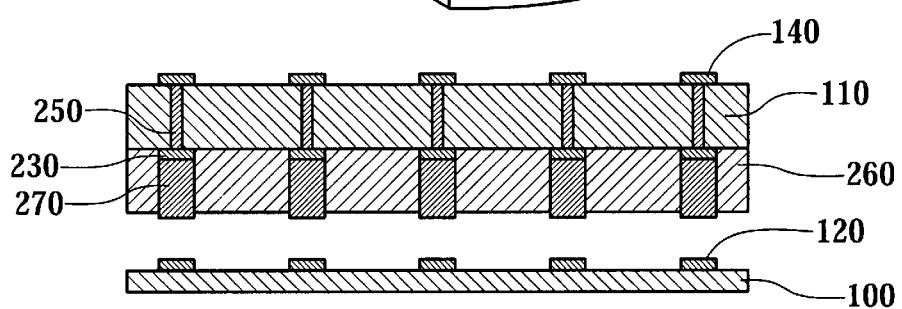
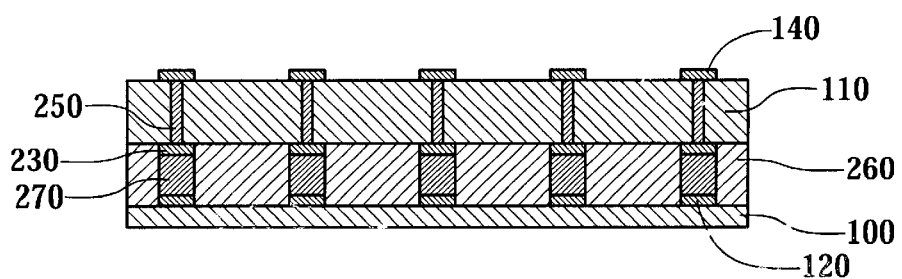

SOLDER COLUMN
BEFORE  AFTER
410
100mils
10mils
r=5mils
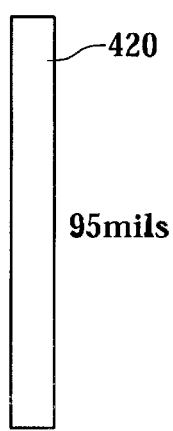
420
95mils
r=x
x=5.13mils
Diameter=10.26mils
SOLDER BUMP
BEFORE  AFTER
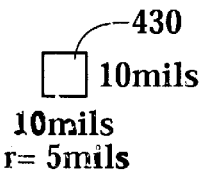
430
10mils
10mils
r= 5mils
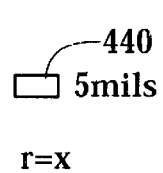
440
5mils
r=x
x=7.07mils
Diameter=14.14mils
*Fig.4*
SOLDER COLUMN
510
100mils
10mils
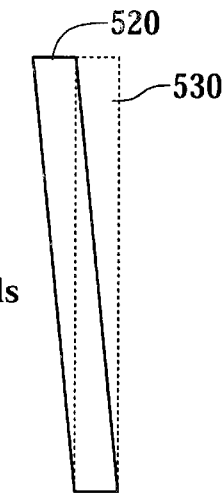
520
530
SOLDER BUMP
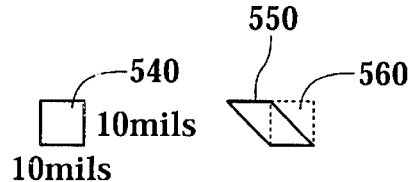
540
10mils
10mils
550
560
*Fig.5*

METHOD FOR CONSTRUCTING A WAFER INTERPOSER BY USING CONDUCTIVE COLUMNS

FIELD OF THE INVENTION

The present invention relates generally to the field of integrated circuits, and more particularly, to an interposer assembly apparatus and method.

BACKGROUND OF THE INVENTION

The three stages of semiconductor device manufacture are wafer fabrication, assembly and testing. The testing stage always includes an evaluation of the electrical connections within the device, and often includes burn-in testing as well. In a conventional manufacturing process, before testing is done, the wafer is diced into individual dies, and the dies are assembled into packages. The purpose of the package is to protect the die as well as provide connections that allow the package to be attached to a testing apparatus or printed circuit board. The fact that the testing of the individual dies does not take place until the dies have been packaged increases the cost. This increased cost stems from the greater complexity, size, and quantity of the testing apparatus, as well as the difficulty of manipulating large quantities of separately packaged dies.

In addition to the tooling and labor costs associated with electrical and burn-in testing of individually packaged dies, there is also the wasted expense of packaging the dies that will subsequently be found to be defective. Since in a conventional process all dies must be packaged before any testing can be done, this means that all defective die will necessarily be packaged, and the expense of doing so is complete waste. For example, if 6%, a conservative estimate, of the dies fail either the electrical or burn-in testing, that is 60 die packaging operations that are wasted for every 1000 dies that are produced. The ability to test the dies before the packaging operations would obviously reduce production costs.

The savings associated with a wafer level testing protocol are multifold. In addition to the savings associated with the elimination of unnecessary packaging operations, inventory carrying costs are reduced because the processing cycle times are reduced since "good" dies are identified earlier in the manufacturing process. An additional benefit can be obtained if the substrate can serve as packaging for the die. The elimination of the requirement for additional packaging after test and burn-in greatly reduces not only direct product costs, but cycle time costs as well.

Two problems exist when attaching a substrate to a wafer to form a wafer interposer. The first is variances in planarity between the substrate and the wafer. Any planar variances require further variances in the height of the solder connections used to attach the two surfaces. Since the solder connections will have height variances, they must be able to absorb enough compression force to make all the contacts. The second problem is the difference between the two surfaces in thermal expansion. Temperature excursions cause one material to expand at a different rate than the other. This causes a shear force to be exerted against the solder connecting the wafer and substrate. Underfill can help reduce this shear force. However, if the thermal expansion differences are great enough, not even underfill will prevent the solder connections from breaking and losing connection.

Accordingly, there is a need for an interposer connection technique that meets all of the criteria outlined above, allows testing at the wafer level before dicing, and eliminates the need for temporarily packaging the die in a carrier, as well as providing packing for the semiconductor die.

SUMMARY OF THE INVENTION

The present invention provides a method and apparatus for testing wafers that is simple and allows testing prior to dicing so that the need to temporarily package individual dies for testing is eliminated. As a result, the number of manufacturing steps is reduced, thus increasing first pass yields. In addition, manufacturing time is decreased, thereby improving cycle times and avoiding additional costs.

The interposer assembly of the present invention revolutionizes the semiconductor fabrication process by enabling burn-in and parametric testing at the wafer level. The interposer eliminates the need to singulate, package, test, and unpackage each die in order to arrive at the Known Good Die product stage. The interposer remains attached to the die following dicing, and thus provides the additional benefit of redistributing the die I/O pads so that they can be larger and more easily accessed and/or mated to other downstream components.

One form of the present invention provides a technique for constructing an interposer using conductive columns to form an interconnection between a substrate and a wafer. Conductive columns are capable of absorbing height compression as well as shear forces to a much greater extent than a typical conductive bump. The conductive columns can be formed using a variety of techniques.

Another form of the present invention provides an interposer assembly comprising a substrate, a wafer, connecting material and no-flow underfill. The substrate and the wafer each have an upper and a lower surface. The upper and lower surfaces of the substrate have one or more electrical contacts. The upper surface of the wafer further comprises one or more die, each die having electrical contacts. The electrical contacts of the upper surface of the substrate are connected to the electrical contacts of the lower surface of the substrate through electrical pathways. Connecting material in the form of conductive columns, subsequently surrounded by no-flow underfill, physically connects the electrical contacts of the lower surface of the substrate to the electrical contacts of the die, providing a total connection path from the die to the electrical contacts on the upper surface of the substrate.

BRIEF DESCRIPTION OF THE DRAWINGS

The above and further advantages of the present invention may be understood by referring to the following description in conjunction with the accompanying drawings in which corresponding numerals in the different figures refer to the corresponding parts in which:

FIG. 1 depicts an exploded view of an interposer substrate and a wafer in accordance with the present invention;

FIG. 2 depicts a side view of an interposer substrate and a wafer prior to attachment in accordance with the present invention;

FIG. 3 depicts a side view of an interposer substrate and a wafer after attachment to form an interposer assembly in accordance with the present invention;

FIG. 4 depicts the results of compression on conductive bumps versus conductive columns in accordance with the present invention; and FIG. 5 depicts the results of shear force on conductive bumps versus conductive columns in accordance with the present invention.

DETAILED DESCRIPTION

While the making and using of various embodiments of the present invention are discussed herein in terms of an interposer substrate and wafer interposer assembly method and apparatus, it should be appreciated that the present invention provides many applicable inventive concepts that can be embodied in a wide variety of specific contexts. The specific embodiments discussed herein are merely illustrative of specific ways to make and use the invention and are not meant to limit its scope in any way.

FIG. 1 depicts a wafer 100 and a substrate 110. When attached to one another the pair forms an interposer assembly. An exploded view of a single die is shown on the wafer 100 enclosed by a dotted line. The die has sixteen peripheral connection pads 120. An actual wafer would have many more die, each die having many more pads; the enlarged view is for illustrative purposes only.

FIG. 1 also depicts a substrate 110. The expanded view of the die on wafer 100 is also shown on the topside of substrate 110. Enlarged pads 140 correspond to pads 120 on wafer 100. A pattern of pads that are the mirror image of pads 120 exist, but are not shown in FIG. 1, on the bottom of substrate 110. Pads 140 and the bottom pads of substrate 110 are connected by vias or electrical pathways. As shown later, when substrate 110 and wafer 100 are connected, pads 140 will be connected to pads 120.

It is important that the surfaces of the wafer and the substrate that will meet when the interposer assembly is formed are very flat. Due to the nature of the processing involved to produce the wafer, they are generally already very flat. The substrate can be polished on the lower surface in order to achieve approximately the same flatness as that of the wafer. The polishing will be done prior to the addition of the connectivity pads to the lower surface of the substrate.

FIG. 2 depicts a side view of wafer 100 and substrate 110 after the application of conductive column 270 and no-flow underfill 260. The wafer and substrate are now ready to be joined to form an interposer assembly. At this point the underfill is not cured. In FIG. 2, pads 230 are shown. Pads 230 are in a pattern that exactly matches pads 120. Also shown are electrical pathways or vias 250 that connect pads 230 to pads 140.

Conductive column 270 is applied to pads 230 on substrate 110. As discussed herein, a column can be defined as a shape whose height is greater than its width or diameter. The method of application may be screen printing, photolithography, solder jet printing, dispensing or any other method known in the industry. The material of conductive column 270 may be, but is not limited to, solder, conductive polymeric adhesive or conductive plastic. A partially cured no-flow underfill can serve as a mask for the deposition of the conductive column material. Although not shown, underfill 260 and conductive column 270 could also exist on wafer 100. To achieve even greater height, conductive column 270 and underfill 260 could exist on both wafer 100 and substrate 110. A layer of no-flow underfill 260 is applied after the application of conductive column 270.

FIG. 3 depicts substrate 110 connected to wafer 100, thus forming an interposer assembly. Substrate 110 and wafer 100 are aligned and then brought together. Many means for alignment may be used, including aligning the edges of the respective components as well as the use of fiducials located on the wafers. Split vision optics may also be employed for alignment.

Once substrate 110 and wafer 100 have been aligned and brought together, the assembly is then heated to connect pads 120 and pads 230 through conductive columns 270 and to cure the underfill. Pads 140 become the connection points for attachment to a printed circuit board or other surface. The total connection path is from pads 120 through conductive columns 270, pads 230 and electrical pathways of vias 250 to pads 140. Conductive columns 270 serve to compensate for thermal mismatches between substrate 110 and wafer 100 by adjusting to any slight lateral movement cause by a thermal mismatch between the components.

Once the interposer assembly has been formed, testing of the dies on the wafer can proceed. Pads 140 on the interposer assembly facilitate connection with burn-in boards or automated test equipment. The last test before the interposer assembly is diced into separate die units is to create a map of the die positions that indicates which are acceptable for further use. Following the dicing procedure the unacceptable units are culled and discarded.

A conductive column can absorb the shear force and z-axis variances that are inherent in wafer interposers. FIG. 4 depicts the results of compression on conductive bumps versus conductive columns. Both conductive bump 430 and conductive column 410 initially have diameters of 10 mils. Conductive bump 430 is 10 mils high and conductive column 410 is 100 mils high. Assume that both must compress 5 mils to accommodate height differences between a wafer and a substrate (not shown). Conductive column 420 and conductive bump 440 represent conductive column 410 and conductive bump 430, respectively, after compression. The diameter of conductive column 420 is 10.26 mils, while the diameter of conductive bump 440 is 14.14 mils. The diameter of conductive column 420 is only 0.26 mils greater than the diameter of conductive column 410. The diameter of conductive bump 440 is 4.14 mils greater than the diameter of conductive bump 430. A 40% expansion in diameter will cause problems with underfill displacement and shorting to adjacent conductive bumps.

FIG. 5 depicts the results of shear force on conductive bumps versus conductive columns. Conductive column 510 has a height of 100 mils and a diameter of 10 mils. Conductive bump 540 has a height of 10 mils and a diameter of 10 mils. Assume that a shear force, the result of thermal mismatches, is applied to both conductive column 510 and conductive bump 540, causing each to move 10 mils to the left at the top. The original position of conductive column 510 is shown as conductive column 530, while the new position of conductive column 510 is shown as conductive column 520. Similarly, the original position of conductive bump 540 is shown as conductive bump 560, while the new position of conductive bump 540 is shown as conductive bump 550. Conductive bump 540 would certainly sustain an unacceptable amount of damage as a result of this deformation. Conductive column 510 would not.

While specific alternatives to steps of the present invention have been described herein, additional alternatives not specifically disclosed but known in the art are intended to fall within the scope of this invention. Thus, it is understood that other applications of the present invention will be apparent to those skilled in the art upon the reading of the described embodiments and a consideration of the appended claims and drawings.

What is claimed is:

1. An interposer assembly comprising:
   a substrate having an upper surface and a lower surface, one or more first electrical contacts on the lower surface, one or more second electrical contacts on the upper surface, one or more electrical pathways passing through the substrate, and connecting the first electrical contacts to the second electrical contacts;

a wafer including one or more dies, and having an upper surface and a lower surface, one or more third electrical contacts on the upper surface of the wafer, the third electrical contacts being associated with the dies;

a conductive column electrically connecting each first electrical contact with a corresponding third electrical contact; and a layer of no-flow underfill disposed between the upper surface of the wafer and the lower surface of the substrate.

2. The interposer assembly as recited in claim 1 wherein the first, second and third electrical contacts are connection pads.

3. The interposer assembly as recited in claim 1 wherein the conductive column comprises solder.

4. The interposer assembly as recited in claim 1 wherein the conductive column comprises a conductive-polymer containing adhesive.

5. The interposer assembly as recited in claim 1 wherein the conductive column comprises a conductive plastic.

6. A method for producing an interposer assembly comprising the steps of:

attaching one or more first electrical contacts to a lower surface of a substrate;

attaching one or more second electrical contacts to an upper surface of the substrate;

creating one or more electrical pathways passing through the substrate and connecting the first electrical contacts to the second electrical contacts;

depositing a conductive column and a no-flow underfill and bonding the substrate to a wafer such that the conductive column and the no-flow underfill form an adhesive bond between the lower surface substrate and the wafer.

7. The method as recited in claim 6, wherein the conductive column is applied to the first electrical contacts on the lower surface of the substrate, and the no-flow underfill is applied to the lower surface of the substrate.

8. The method as recited in claim 6, wherein the wafer has an upper surface and a lower surface, and the conductive column is applied to one or more third electrical contacts on the upper surface of the wafer; and the no-flow underfill is applied to the upper surface of the wafer.

9. The method as recited in claim 6, wherein:

the conductive column is applied to the first set of electrical contacts on the lower surface of the substrate and to one or more third electrical contacts on an upper surface of the wafer; and the no-flow underfill is applied to the lower surface of the substrate and the upper surface of the wafer.

10. The method as recited in claim 6, wherein the conductive column is deposited by screen printing.

11. The method as recited in claim 6, wherein the conductive column is deposited by photolithography.

12. The method as recited in claim 6, wherein the conductive column is deposited by solder jet printing.

13. The method as recited in claim 6, wherein the substrate and the wafer are aligned so that electrical contact is made possible between the second electrical contacts on the upper surface of the substrate and one or more third electrical contacts on an upper surface of the wafer by the bonding.

14. The method as recited in claim 13, wherein the substrate and the wafer are aligned using fiducials.

15. The method as recited in claim 13, wherein the substrate and the wafer are aligned using split vision optics.

16. The method as recited in claim 6 wherein the first and second electrical contacts comprise connection pads.

17. The method as recited in claim 6 where in the step of attaching the substrate to the wafer comprises the steps of:

placing the wafer on a first flat surface and holding the wafer in place;

placing the substrate on a second flat surface and holding the substrate in place; and bringing the first and second flat surfaces together so that the wafer and the substrate form an adhesive bond.

18. The method as recited in claim 6 further comprising the step of singulating the interposer assembly into one or more die assemblies.

19. The method as recited in claim 6 wherein the underfill forms a rigid bond.

20. The method as recited in claim 6 wherein the underfill forms a semi-rigid bond.

21. The method as recited in claim 6 wherein the underfill forms a compliant bond.

22. The method as recited in claim 6 wherein the conductive column comprises solder.

23. The method as recited in claim 6 wherein the conductive column comprises a conductive-polymer adhesive.

24. The method as recited in claim 6 wherein the conductive column comprises a conductive plastic.

* * * * *